United States Patent [19]
Nitanda et al.

[11] Patent Number: 5,359,452
[45] Date of Patent: Oct. 25, 1994

[54] LITHIUM TANTALATE MONOCRYSTAL, MONOCRYSTAL SUBSTRATE, AND PHOTO ELEMENT

[75] Inventors: Fumio Nitanda; Yasunori Furukawa; Masayoshi Sato; Kohei Ito, all of Fukaya; Satoshi Makio, Kumagaya, all of Japan

[73] Assignee: Hitachi Metals, Ltd., Tokyo, Japan

[21] Appl. No.: 46,955

[22] Filed: Apr. 16, 1993

[30] Foreign Application Priority Data

| Apr. 24, 1992 | [JP] | Japan | 4-105075 |
| May 8, 1992 | [JP] | Japan | 4-115749 |
| Oct. 7, 1992 | [JP] | Japan | 4-293832 |

[51] Int. Cl.$^5$ .............................................. G02F 1/37
[52] U.S. Cl. .................... 359/328; 385/122; 423/635; 423/641
[58] Field of Search .............. 156/600, 605, 617.1, 156/DIG. 87; 359/326-332; 385/122, 141; 423/592, 593, 635, 641

[56] References Cited

U.S. PATENT DOCUMENTS

| 3,262,058 | 7/1966 | Ballman et al. | 330/4.5 |
| 3,665,205 | 5/1972 | Bridenbaugh et al. | 307/88.3 |
| 4,144,117 | 3/1979 | Fukuda et al. | 156/617.1 |
| 4,371,419 | 2/1983 | Fukuda et al. | 156/617.1 |
| 4,953,931 | 9/1990 | Miyazaki et al. | 359/328 |
| 4,953,943 | 9/1990 | Miyazaki et al. | 350/96.12 |
| 5,039,187 | 8/1991 | Ballman et al. | 385/130 |
| 5,175,784 | 12/1992 | Enomoto et al. | 385/122 |
| 5,209,917 | 5/1993 | Ohno et al. | 423/592 |
| 5,221,310 | 6/1993 | Mizuuchi et al. | 65/30.13 |

FOREIGN PATENT DOCUMENTS

60-32843  7/1985  Japan .............. G02B 6/12

*Primary Examiner*—John D. Lee
*Attorney, Agent, or Firm*—Sughrue, Mion, Zinn, Macpeak & Seas

[57] ABSTRACT

0.1% or more of Mg by weight is added to lithium tantalate monocrystal materials wherein the amount of Fe is restricted to 10 ppm by weight or less to improve light transmittance in the short wavelength range of blue light and to shift the fundamental absorption edge to the shorter wavelength.

32 Claims, 5 Drawing Sheets

LITHIUM TANTALATE MONOCRYSTAL, MONOCRYSTAL SUBSTRATE, AND PHOTO ELEMENT

BACKGROUND OF THE INVENTION

1. Field of the Invention

This invention relates to a monocrystalline waveguide material for use, for example, in an SHG (second harmonic generation) source for light recording and measurement and, more particularly, relates to a lithium tantalate monocrystal with improved light transmittance by the addition of Mg, a monocrystalline material for use in an optical waveguide, a monocrystal substrate, and a photo element incorporating this.

2. Related Art

Generally, in fields such as optical recording, a shortening in the wavelength of laser sources is strongly desired for improvement of recording density. The shorter the wavelength, the higher the recording density. Currently, laser sources in the range of 280–400 nm of wavelength, or blue to near ultraviolet are in demand. To realize such a source, the conversion of a semiconductor laser with a wavelength of 830 nm into a blue light of half that wavelength, 415 nm, by use of optical waveguide SHG elements has gained considerable attention. As discussed on pages 731–732 of the Electronics Letters, 25, 11 (1989), for example, a method of performing phase matching by using periodic polarization Inversion has been proposed.

Concerning a suitable monocrystalline waveguide material for use in such an SHG element, a lithium niobate (hereinafter abbreviated as LN) monocrystal has been generally used up to now, having a large non-linear optical coefficient (refer to U.S. Pat. Nos. 3,262,058 and 3,665,205). To produce this SHG element, periodic grids are produced on an $LiNbO_3$ substrate by Ti diffusion and heated up to about 1100° C. to selectively invert the polarization of the periodic grid layers, as shown in FIG. 4, for example. An optical waveguide is then produced by means of the proton exchange method wherein a fundamental wave is injected to obtain SHG light. However, LN monocrystals cannot be used in the short wavelength range of up to 280 nm currently required, because the fundamental absorption edge, which indicates wavelength below which the light transmittance of the crystal becomes zero, is in the vicinity of 320 nm.

In contrast, ever since it was reported that a low loss optical waveguide could be produced by the proton exchange method as discussed on pages 45–60 of Nikkei New Materials (Nov. 4, 1991), lithium tantalate (hereinafter abbreviated as LT) monocrystal has gained considerable attention in recent years as a substrate material for a wavelength conversion element generating second harmonic wave by the quasi-phase matching method for the reason that lithium tantalate crystal exhibits excellent photorefractive damage resistance.

This LT monocrystal has an ilmenite structure as does LN monocrystal and is a ferroelectric crystal with a melting point of about 1650° C. and Curie temperature of about 600° C. It is usually grown from melt by the Czochralski method using an iridium crucible in an inert atmosphere with or without oxygen. Because the resultant monocrystal is in multi-domain state, a poling process is performed by slow cooling with an applied electric field in the air or an oxygen atmosphere after maintaining the crystal above the Curie temperature. Later, the crystal is processed into a wafer and used in large quantities as substrates for surface acoustic wave elements. Although the crystal is usually of brown or light yellow color due to the mixture of precious and transient metals from the crucible and of impurities from the starting materials and refractories in the furnace, it is used as substrates for surface acoustic wave elements without any associated problems. However, this LT monocrystal has not been used very much for optical applications up to now because of its small birefringence. To utilize LT as SHG material, the method has been attempted as discussed on pages 2732–2734 of Apply. Phys. Lett. 58 (24) (1991), for example, wherein periodic grids are produced by the proton exchange method instead of Ti diffusion, heated up to about 600° C. to selectively invert the polarization of the periodic grid layers, thereby producing an optical waveguide by the proton exchange method. This is illustrated in FIG. 5. Such a photo device generates about 15 mW SHG light with a waveguide width of about 4 $\mu$m a waveguide depth of about 2 $\mu$m and a wavelength of about 433 nm, resulting in & light power density as large as about 188 $kW/cm^2$.

Other known inventions relating to LT monocrystal include, for example, that relating to an LT optical waveguide produced on an LT substrate with 10 mol % or less of MgO added, as presented in Japanese Patent Publication (Koukoku) No. 32843/1985. This invention aims at reducing the refractive index by the addition of MgO to improve the relative refractive index of the optical waveguide to confine light.

In addition, potassium titanium phosphate (hereinafter abbreviated as KTP) monocrystal, which has the fundamental absorption edge in the vicinity of 350 nm, is widely used for the generation of green light having a slightly longer wavelength (U.S. Pat. No. 5,039,187)

However, because lithium tantalate monocrystal produced by the aforementioned prior art is of brown or light yellow color due to the mixture of precious and transient metals from the crucible and of impurities from the starting materials and refractories in the furnace and absorbs light in the visible ray range, it cannot be used for photo elements using visible rays. Also, impurities increase photorefractive damage, presenting a big problem by hindering the practical optical use of the monocrystal.

The main cause of the aforementioned light absorption is assumed to be transient metal impurities such as iron contained in the crystal. If the impurities are reduced to 1 ppm or less, for example, light transmittance is obviously improved. However, it is difficult to eliminate impurities completely. The reasons are that in the growth of oxide monocrystals, the purity of available materials is about 4N–5N and there is also a certain limit to the reduction in impurities since growing crystals imbibe impurities from the crucible material and refractory insulating materials in the furnace making it difficult to produce the crystals to the purity comparable to that of a semiconductor. In addition, oxygen vacancies are also taken into the crystal depending on the growth and the heat treatment conditions, to also cause coloring and light absorption.

The compact, light-weight blue light sources developed in recent years can only generate SHG light with a minimum wavelength of about 400 nm. Reasons for this include the fact that light absorption by the lithium tantalate monocrystal substrate is large in the visible ray range and that the fundamental absorption edge is around 280 nm or longer.

Furthermore, the Inventor of the present invention has found that LT monocrystal has a serious problem in that while it has high feasibility in the short wavelength range because the fundamental absorption edge is in the vicinity of 270 nm, the light transmittance drastically decreases in the 280–400 nm band.

Although light induced refractive index change called photorefractive damage present a problem for a monocrystal used in an optical use, especially in an optical waveguide where light energy density is high, few inventions for improvement have been made because the monocrystal has so far been limited in its application to SAW.

Although it has been said that lithium tantalate monocrystal produced by the aforementioned prior art is higher in photorefractive damage resistance than lithium niobate monocrystal, the inventor of the present invention et al have found it to be more sensitive to photorefractive damage than lithium niobate monocrystal and that photorefractive damage occurs in the practical optical use of wavelength conversion elements, hindering the practical use of the monocrystal. Photorefractive damage mentioned herein means local variation in the refractive index of crystal due to injected laser light, known as light induced refractive index change. The cause of this photorefractive damage is said to be transient metal impurities contained in the crystal and this phenomenon is specifically explained by the change in the valence state of Fe ions within the crystal, as follows. When light is injected in a direction not parallel to the Z (optical) axis of the crystal, $Fe^{2+}$ ions in the high light intensity part of the light irradiated zone are excited and emit electrons in the conduction band, thereby changing to $Fe^{3+}$ ions. The electrons thus generated are generally captured by other $Fe^{3+}$ ions present in the non-irradiated or low irradiated zones of the crystal and these ions are changed to $Fe^{2+}$ ions. The overall effect of such a phenomenon results in changes in space charge distribution, and in consequence, in local refractive index non-uniformity through the electro-optical effect of the crystal itself. When crystal is used as substrates for optical applications such as light modulators and wavelength conversion elements, considerable problems arise due to refractive index changes in the light irradiated zone preventing the element from operating stably and inhibiting the full use of the properties inherent to the crystal.

The shorter the light wavelength, the more increased the photorefractive damage Photorefractive damage is therefore more serious problem to elements using shorter wavelength light. It has been said that the occurrence of photorefractive damage is especially remarkable in lithium niobate monocrystal and that lithium tantalate is high in photorefractive damage resistance as compared with lithium niobate monocrystal. Lithium tantalate monocrystal has so far been used for surface acoustic elements, and in this application, although the crystal contains large amounts of sub-grain boundaries and transient metal impurities, they do not have any substantially negative effect on the element properties. In optical applications, however, problems occur such as the unstable operation of elements due to photorefractive damage and light scattering at sub-grain boundaries. Also, even with the electric field annealing method, which has so far proven to be effective for improving photorefractive damage resistance, photorefractive damage occurs as the power density of the element increases. For these reasons, for elements using short wavelength light, it has not been possible to obtain crystal having satisfactory photorefractive damage resistance.

When lithium niobate monocrystal is used for substrates, it suffers from the effect of fundamental absorption edge at a wavelength of 400 nm because the fundamental absorption edge of lithium niobate monocrystal is in the vicinity of 320 nm, resulting in poor light transmittance and it is therefore difficult to generate shorter wavelength light than in the case of lithium tantalate. In order to develop a shorter wavelength light source, a monocrystalline substrate material having excellent light transmittance In a short wavelength range is required. However, no suitable monocrystalline waveguide material that can be used in the short wavelength range has been available because of problems such as light absorption due to impurities contained in conventional lithium tantalate monocrystal and due to coloring by oxygen vacancies.

In addition, KTP monocrystal cannot be used in a shorter wavelength range than LN monocrystal because the fundamental absorption edge is in the vicinity of 350 nm.

SUMMARY OF THE INVENTION

The object of this invention is to provide lithium tantalate monocrystal with improved light transmittance in the short wavelength range by the addition of Mg arid the production method thereof, in addition to the photo element using the monocrystal.

This invention aims at solving the problem of light absorption by conventional lithium tantalate monocrystal mentioned above. The object of this invention is to provide lithium tantalate monocrystal with excellent light transmittance and photorefractive damage resistance by adding 0.1 wt % or more of Mg and to produce and operate photo elements stably by using this monocrystal as substrates for SHG elements which use light emitted from a laser source as the fundamental wave to generate a second harmonic wave via a non-linear optical crystal, or for light modulating elements which control light intensity and phase through the electro-optical effect by injecting light emitted from a laser source into the electro-optical crystal.

To achieve the above object, a lithium tantalate monocrystal with improved light transmittance in the 280–400 nm band by the addition of 0.1 percent or more of Mg by weight and limiting Fe to 10 ppm or less by weight is produced for optical use.

In this invention, Mg improves light transmittance in the short wavelength range but if it is less than 0.1% by weight, no effect can be expected.

If Fe exceeds 10 ppm by weight, light absorption occurs in the 280–400 nm band, causing reduction in light transmittance, therefore this is not preferable.

Also, in this invention, it is preferable that the content of Mg ranges from 0.2–1 wt %. If the Mg content is 0.2 wt % or more, there is remarkable improvement effect. However, if it exceeds 1.2 wt %, the crystal is susceptible to cracking due to large internal strain.

Mg may be added in the form of MgO in the material mixing process step or it may be placed into the crucible directly. It should be noted that in this invention, the contents of Mg and Fe are calculated from (Mg content)/($LiTaO_3$ content + Mg content) and (re content)/($LiTaO_3$ content + Fe content), respectively.

In an effort to apply lithium tantalate monocrystal to optical elements, a review was made to improve the quality by reducing impurities and sub-grain boundaries, etc. As a result, concerning the photorefractive damage of lithium tantalate, in spite of the established theory that lithium tantalate is high in photorefractive damage resistance, it has been found that it is lower than lithium niobate monocrystal. In addition, it has been found that although photorefractive damage resistance be improved by reducing the transient metal impurities such as iron and by oxidation of growing crystal with heat treatment, this is insufficient for optical element application.

To achieve the above object, the inventor of the present invention adopted the method wherein lithium tantalate monocrystal is grown by adding 1 mol % or more of MgO in order to improve the light transmittance and photorefractive damage resistance of the lithium tantalate monocrystal. By adding 1 mol % or more, light transmittance was improved in the 280–400 nm wavelength range as compared with the case where no Mg is added, as shown in FIG. 3 and photorefractive damage resistance was also enhanced. The fundamental absorption edge of LT monocrystal containing 2 mol % or more of MgO was shifted to the shorter wavelength, as compared with crystal containing no MgO, and the coloring in the crystal disappeared and it became colorless and transparent.

Furthermore, to achieve the above object, the inventor of the present invention processed the lithium tantalate monocrystal with excellent light transmittance thus obtained into a wafer shape and used it as photo element substrates. By periodically inverting the polarization direction of lithium tantalate monocrystal, SHG light was generated with an efficiency inherent to an SHG element having ideal polarization inverted grids.

With the above configuration, the light transmission properties and photorefractive damage resistance of the crystal can be greatly improved. In addition, because the crystal thus obtained has improved photorefractive damage resistance and uniformity, it can be used to operate various optical elements, especially those using short wavelength light, such as wavelength conversion elements, light modulators, and deflectors.

In the embodiment of this invention, there is no limit to the methods for growing monocrystal. The Czochralski method is generally used while in some cases, the Bridgman method, floating zone method, and fiber pedestal method may also be used.

In this invention, uniform, large-size monocrystal can be grown easily if lithium tantalate monocrystal production equipment is used which comprises a double-walled crucible for holding melted liquid, a heating means mounted on the periphery of the double-walled crucible, and a means for obtaining monocrystal by allowing a seed crystal to contact the melted liquid in the double-walled crucible and drawing it up.

As for the compound ratio of the materials $Li_2CO_3$ and $Ta_2O_5$, normal congruent composition is preferable in terms of monocrystal growth because it allows high quality monocrystal to be easily obtained. Depending on the element application, monocrystal substrates with different refractive indexes, may be necessary. In this ease, desired monocrystal substrates may be obtained by changing the compound ratio of $Li_2CO_3$ and $Ta_2O_5$.

It is preferable to add Mg when mixing to ensure material uniformity. Alternatively, it may be added during the melting of the materials.

The inventor of this invention presumes that the reason why the addition of Mg improves light transmittance in the short wavelength range and restricts photorefractive damage, is as follows: Fe exists in the form of $Fe^{2+}$ or $Fe^{3+}$ ions in the crystal. The $Fe^{3+}$ ion has a proper absorption in the vicinity of 300 nm and the $Fe^{2+}$ ion in the vicinity of 380 nm. This causes reduction in light transmittance in the short wavelength range.

Electrons are excited from $Fe^{2+}$ ions into the conduction band due to light irradiation. The electrons move inside the crystal and are captured by $Fe^{3+}$ ions in the non-irradiated zone, producing an internal electric field inside the crystal, thus causing photorefractive damage.

Reducing Fe impurities is essentially important to improve light transmittance and restrict photorefractive damage. It is however practically impossible to reduce Fe impurities to zero when considering the materials currently available and the purity of the crucible.

Added Mg is considered to substitute the Li site of the crystal. From the difference In valence between Li and it is considered that the Mg deprives $Fe^{2+}$ ions of electrons, thereby changing them to $Fe^{3+}$ ions. In other words, by adding Mg, the valence of the Fe impurities in the crystal is changed from 2 to 3. This reduces the broad absorption caused by $Fe^{2+}$ in the vicinity of 380 nm, contributing to improvement in light transmittance in this wavelength range.

Also, because the number of $Fe^{2+}$ ions decreases, the electrons excited into the conduction band by light irradiation decrease, thereby decreasing photorefractive damage.

Furthermore, adding Mg causes a shallow impurity level to be formed in the energy gap of the crystal, increasing the electrical conductivity of the crystal. This has the effect of cancelling the electric field induced in the crystal by light irradiation, and further alleviates photorefractive damage.

The other objects of this invention will be made clear with the claims and the detailed description of the invention based on the accompanying drawings.

DETAILED DESCRIPTION OF THE PREFERRED EMBODIMENTS

Figure 1:
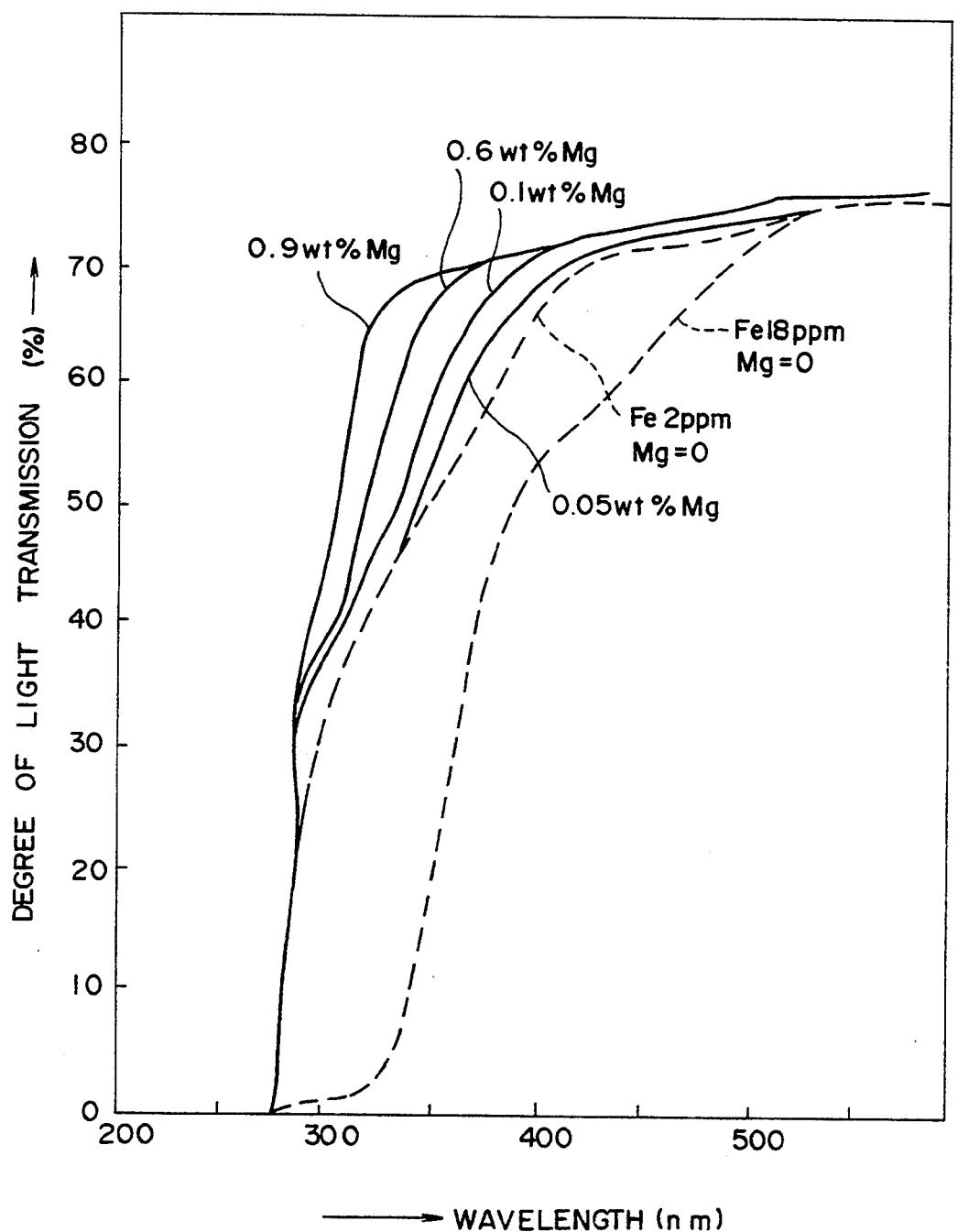
FIG. 1 is a diagram showing the light transmission properties, obtained by measurement of the various lithium tantalate and lithium niobate monocrystals in the first embodiment.

The preferred embodiments of this invention are described below in detail, referring to the accompanying drawings.

Embodiment 1

Specimens were prepared by the following method. First, 521.2 g of $Li_2CO_3$, 3471.2 g of $Ta_2O_5$, and 7.6 g of MgO were measured. This 4 kg amount of $LiTaO_3$ materials (purity: 4N) were mixed and sintered for five hours at 1100° C. In this case, the MgO content was 1.3 mol % from $MgO/(LiTaO_3+MgO)$. The materials were then placed into an iridium crucible with a diameter of 100 mm and height of 100 mm and melted by radio frequency heating into liquid form. A seed was then dipped to grow a monocrystal of 50 mm in diameter and 70 mm in length in predetermined directions over about three days.

The growth rate was 1-2 mm/h and the rotation speed 10-20 rpm. Next, poling process was performed on the crystal grown by the above method. A Pt electrode, for example, was mounted facing the Z faces of the crystal through electrically conductive powder which was non-reactive with the crystal and placed in an electric furnace to perform a poling process. Then, square blocks of $10 \times 10 \times 10$ $mm^3$ with each edge parallel to the X, Y, and Z axes were cut from each crystal, and each surface of the blocks was polished in a mirror finish fashion. 2-inch wafers were also produced from each crystal. Analyzing the LT crystal thus grown by the EPMA method, the Mg content was 0.1 wt %. The concentration of Fe impurities analyzed by the atomic absorption method was 2 ppm.

Although in the above description, MgO was added in the material mixing step, this invention is not limited to the abovementioned and MgO may be added separately after the $LiTaO_3$ materials are mixed and sintered, as described below.

First, 546 g of $Li_2CO_3$ and 3454 g of $Ta_2O_5$ were measured and mixed and sintered for five hours at 1100° C. to make $LiTaO_3$ material, then 36 g of MgO was added to the material. They were placed into an iridium crucible with a diameter of 100 mm and height of 100 mm and melted by radio frequency heating into liquid form. A seed was then dipped to grow monocrystal by the same operation as above. When the crystal thus grown was analyzed by the EPMA method, the Mg content was 0.6 wt %. The concentration of Fe impurities analyzed by the atomic absorption method was 2.5 ppm. The MgO content was 6 mol %. In this way, various monocrystals were grown having different Mg weight percentages. The Fe weight percent was 10 ppm or less in all cases.

The various monocrystals thus grown were investigated for light transmission properties. The results are given in FIG. 1. FIG. 1 also shows for comparison, the properties of monocrystal with no Mg added.

LT crystal containing 18 ppm of Fe and no Mg has large light absorption in the wide wavelength range of 300-500 nm. When transient metal impurities such as iron are reduced to 2 ppm, light absorption in the 300-500 nm range decreases as compared with crystal containing substantial iron but light absorption below 400 nm is considerably high and therefore light transmittance is inadequate for substrates for the generation of blue SHG light of 400 nm or less.

In a crystal with a slight amount of Mg added, the fundamental absorption edge is shifted to the shorter wavelength. As more MgO is added, the fundamental absorption edge is further shifted to the shorter wavelength. Especially, in the range where the Mg content is 0.1 wt % or more, improvement in light transmittance in the wavelength of 280-400 nm is remarkable and it has been found that the fundamental absorption edge is shifted substantially to the shorter wavelength.

When the Fe content exceeds 10 ppm by weight, large light absorption occurs in the 280-400 nm wavelength band, decreasing light transmittance and this is therefore not preferable. Also, when the Mg content is 0.2% or more by weight, a substantial improvement effect occurs, increasing light transmittance. However, when it exceeds 1.2 wt %, internal strain in the crystal increases, making the crystal susceptible to cracking and this is therefore not preferable.

It has been found that adding Mg also improves photorefractive damage resistance.

Embodiment 2

The above embodiment focused on the weight percentage of Mg contained in monocrystal. Alternatively, 1 mol % or more MgO may be added as described below.

Specimens were prepared by the following method. First, about 5 kg of $LiTaO_3$ material powder (material used for crystal growth was a mixture of $Li_2O$, $Ta_2O_5$, and powder with a purity of 4N) was placed into an iridium crucible with a diameter of 100 mm and depth of 120 mm and melted by radio frequency heating to form liquid. A seed was then dipped to grow a two-inch monocrystal in predetermined directions for over about three days by the Czochralski method. The growth rate was 1-2 mm/h and the rotation speed 10-20 rpm. Next, a poling process was performed on the crystal grown by the above method. A Pt electrode, for example, was mounted facing the Z faces of the crystal via electrically conductive powder which is non-reactive with the crystal and placed in an electric furnace to perform a poling domain process. Then, square blocks of $10 \times 10 \times 10$ $mm^3$ with each edge parallel to the X, Y, and Z axes were cut from each crystal, and each surface of the blocks was polished to mirror finish. In the same way, 2-inch wafers were produced from each crystal. In this manner, lithium tantalate monocrystal was prepared and investigated for light transmittance.

Figure 2:
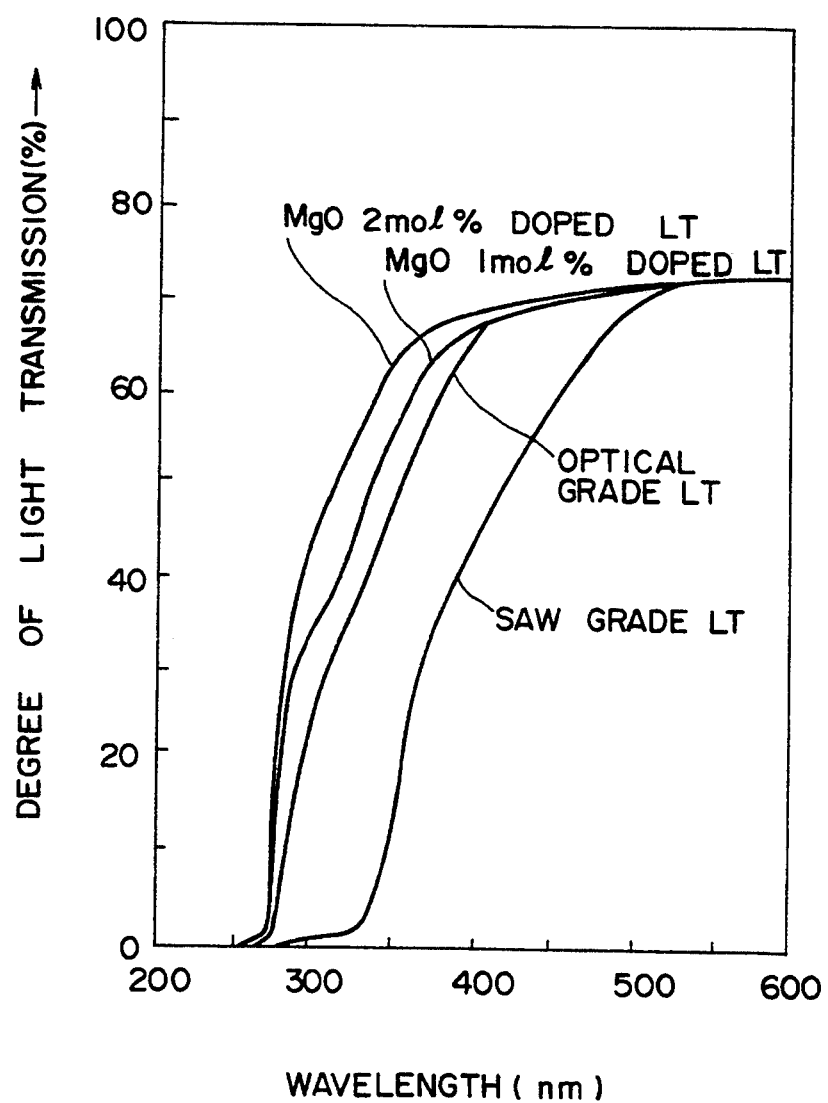
FIG. 2 is a diagram showing the light transmission properties, obtained by measurement of the various lithium tantalate and lithium niobate monocrystals in the second embodiment.

An example of the results is shown in FIG. 2. The SAW-grade lithium tantalate monocrystal containing as much as a few to ten plus a few ppm of transient metal impurities such as iron, has large light absorption in the wide wavelength range of 300-500 nm. Lithium tantalate monocrystal with its transient metal impurities such as iron, manganese, and chromium reduced to 1 ppm or less (referred to as optical grade) has low light absorption in 300-500 nm as compared with a crystal containing a large amount of iron but has a certain absorption at 400 nm or shorter. Therefore the light transmission is not adequate for substrates for the generation of blue SHG light of 400 nm or below. In the crystal with 1 mol % of MgO added, the fundamental absorption edge is shifted to the shorter wavelength by about 2 nm. As more MgO is added, the fundamental absorption edge is shifted to the shorter wavelength even further. The major effect of adding MgO is improvement in light transmittance in the 280-400 nm wavelength range. When this substrate is used, a SHG element generating 390 nm light can be realized by using a 780 nm semiconductor laser, for example, with a fundamental light wavelength of 800 nm or shorter.

Polarization inverted grids were produced by the method shown in FIG. 3, using as substrates the lithium tantalate monocrystal with improved light transmittance with the addition of MgO prepared in embodiment 1, and lithium tantalate monocrystal with no Mg added.

Figure 3A:
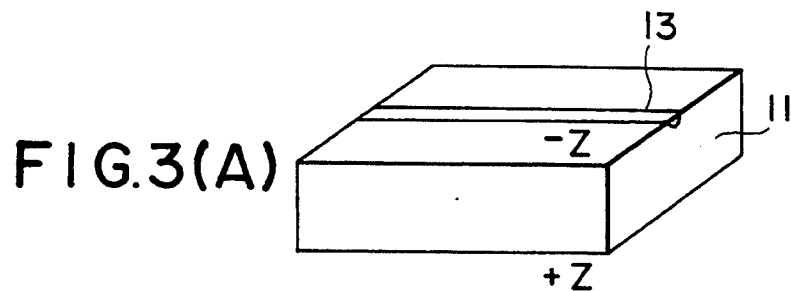
FIG. 3 consists of FIGS. 3(A) to 3(F) showing the method for producing the polarization inverted grids according to this invention.
Figure 3B:
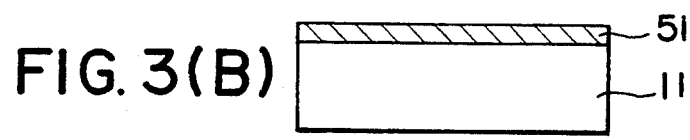
Figure 3C:
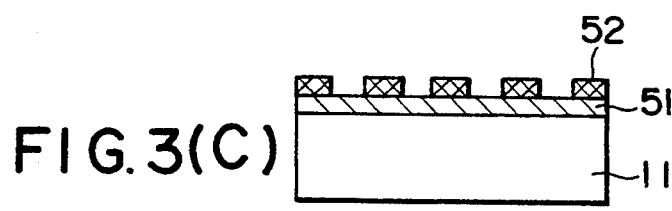
Figure 3D:
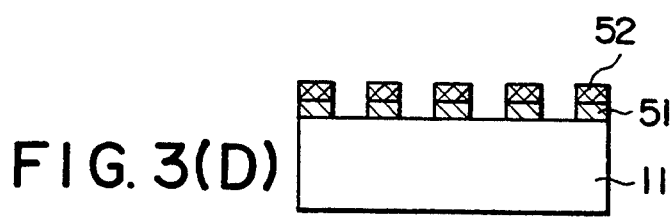
Figure 3E:
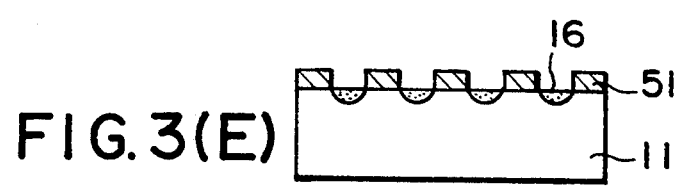
Figure 3F:
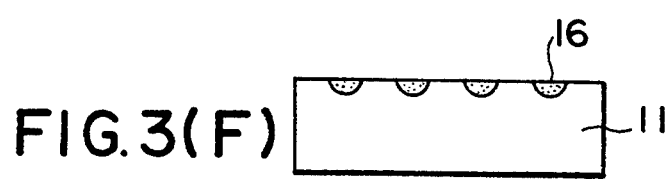
Figure 4:
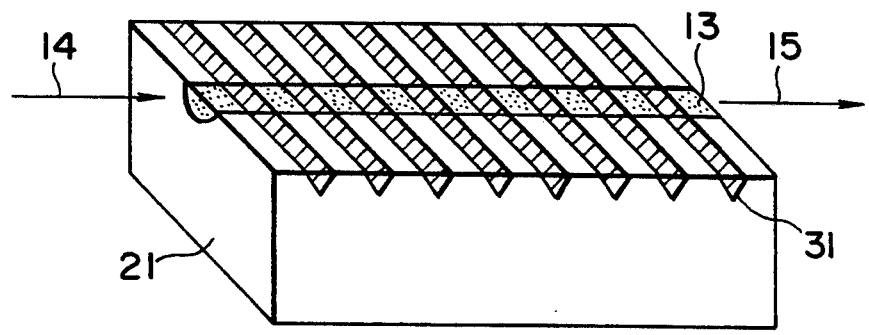
FIG. 4 is a drawing showing a conventional SHG element using triangular polarization inverted grids.
Figure 5:
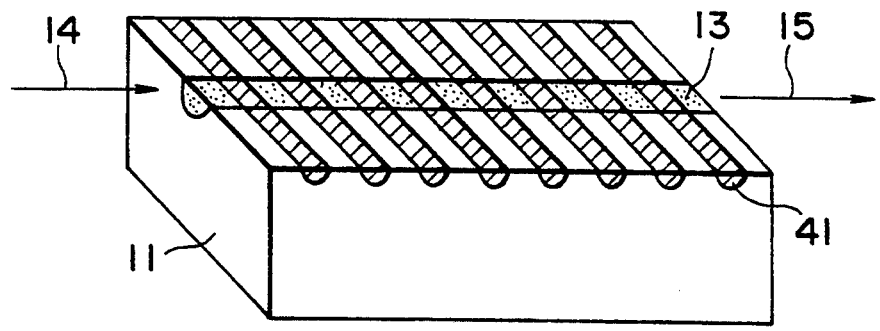
FIG. 5 is a drawing showing a conventional SHG element using semi-circular polarization inverted grids.

As FIG. 3(A) shows, LiTaO$_3$ substrate 11 with the $-Z$ (c) side polished was prepared. As shown In FIG. 3(B), Ta-film 51 was produced to 30 nm on the $-Z$ side of substrate 11 by sputtering. As shown in FIG. 3(C), photoresists 52 were spin-coated onto the Ta-film 51. Patterning of photoresists 52 was performed by normal photolithography using a photo mask with windows corresponding to portions where polarization inversion 12 was to be performed. The pattern period of the photo mask was matched to quasi-phase matching conditions for SHG light generated, ranging 1-10 μm. As FIG. 3(D) shows, patterning of Ta-film 51 was performed through the masking of patterned photoresists 52 by means of dry etching by RIE using CF$_3$Cl gas, or by wet etching. As FIG. 3(E) shows, by removing photoresists 52 with acetone and performing proton exchange with pyrophosphoric acid at 260° C. for 30 to 60 minutes, proton exchange areas or exchange layers 16 were formed. As FIG. 3(F) shows, Ta-film 51 was etched by use of a NaOH aqueous solution. An optical waveguide was then produced on the substrate surface by the normal proton exchange method. Finally, a SHG element was produced by optically polishing the end faces of optical waveguide.

An optical waveguide was produced on the polarization inverted grids described above to produce a SHG element 1 cm in length. When a fundamental wave with a wavelength of 820 nm was injected into the SHG element thus produced using a titanium-sapphire laser as the fundamental wave light source, blue SHG light of 410 nm was obtained. When the polarization inverted grids were rectangular in cross section and the polarization inversion areas were greater in depth than in width in the period direction, a high SHG light output of 15 mW was obtained and stable output was obtained at a power density of 165 kW/cm$^2$. When SHG light output was evaluated by using a semiconductor laser with a wavelength of 780 nm as the fundamental wave and by changing the period of polarization inverted grids, a SHG light output of about 1.5 mW was obtained with an element using MgO-added lithium tantalate monocrystal with improved light transmittance as the substrate at a wavelength of 280-400 nm. On the other hand, SHG light output of only 0.7 mW was obtained with an element using lithium tantalate monocrystal with no MgO added as the substrate because light absorption by the substrate was large.

As mentioned above, when the polarization inversion areas were greater in depth than in width in the period direction, high output SHG light of 15 mW was obtained and stable output was obtained at a power density of 165 kW/cm$^2$.

On the other hand, when the polarization inverted grids were semi-circular in cross section and the polarization inversion areas were smaller in depth than in width in the period direction, SHG light of 9 mW was obtained.

The above reveals that when polarization inverted grids are produced on lithium tantalate monocrystal and the polarization Inversion areas are greater in depth than in width in the period direction, the ratio of the width of the polarization inversion portions to that of the non polarization Inversion portions In relation to the incident light direction becomes 1:1 and that this is useful for producing highly efficient SHG elements.

A light modulator was produced using crystal with improved photorefractive damage resistance as the substrate by the addition of MgO according to this invention, in which light emitted from a laser source was injected into an electro-optical crystal to change the light phase. It was verified that the operation was stable.

Embodiment 3

Next, the effect of Mg addition on photorefractive damage resistance is investigated.

Specimens were prepared by the following method. First, about 5 kg of LiTaO$_3$ material powder (material used for crystal growth was a mixture of Li$_2$O and Ta$_2$O$_5$ powder with a purity of 4N and MgO powder with a purity of 3N-4N) was placed into an iridium crucible with a diameter of 100 mm and depth of 120 mm and melted by radio frequency heating to make liquid form. A seed was then dipped to grow a two-inch monocrystal in predetermined directions over about three days by the Czochralski method. The growth rate was 1-3 mm/h and the rotation speed 10-30 rpm. Next, a poling process was performed on the crystal grown by the above method. A Pt electrode, for example, was mounted facing the Z faces of the crystal through electrically conductive powder which is non-reactive with the crystal and placed in an electric furnace to perform a poling process. Then, square blocks of 10×10×10 mm$^3$ with each edge parallel to the X, Y, and Z axes were cut from each crystal, and each surface of the blocks was polished to a mirror finish. In the same way, 2-inch wafers were produced from each crystal. In this way, lithium tantalate monocrystal was prepared and investigated for improvement in photorefractive damage resistance.

Figure 6:
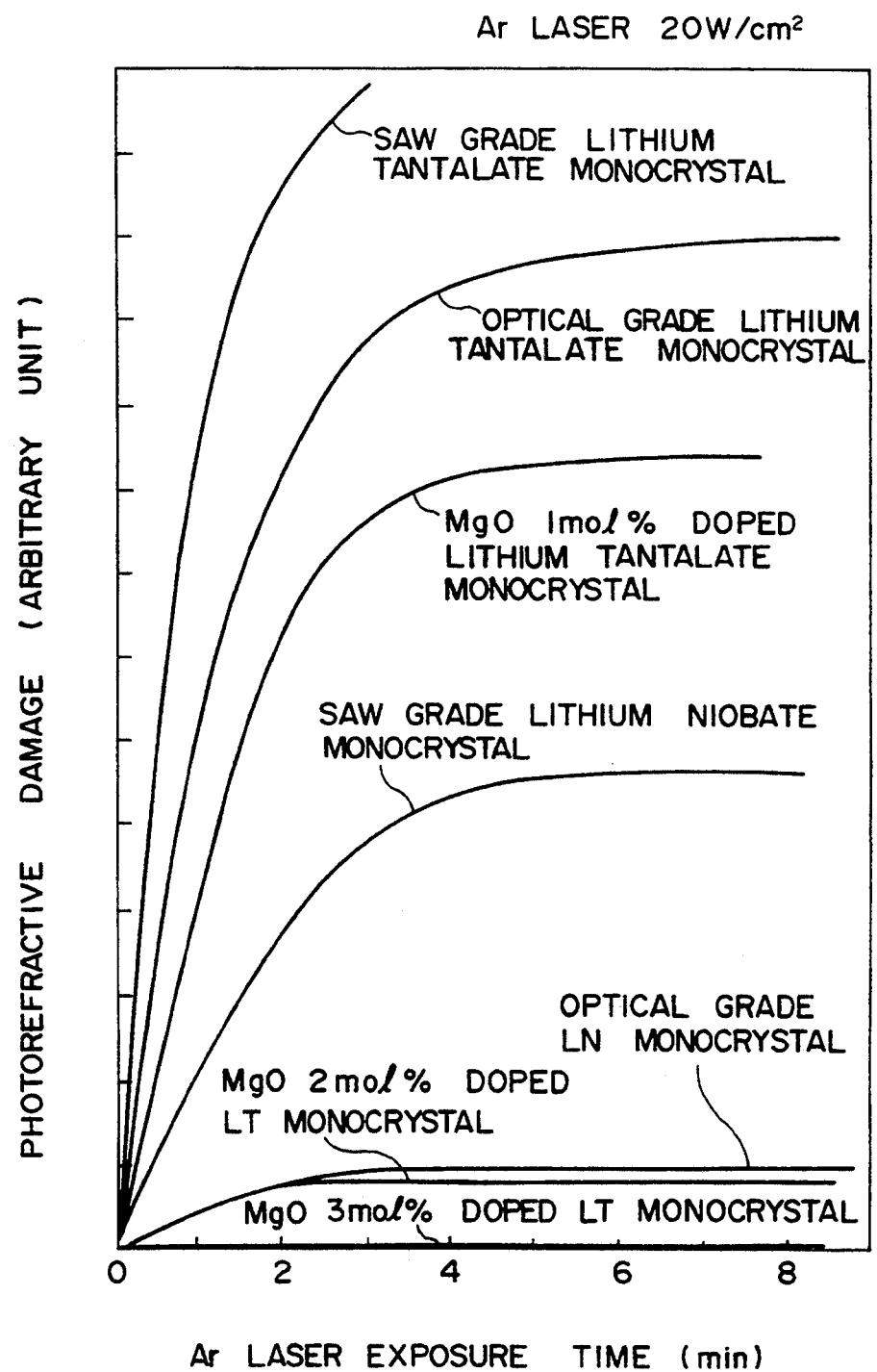
FIG. 6 is a diagram showing the photorefractive damage of various lithium tantalate and lithium niobate monocrystals induced by argon laser injection, in relation to the injection time.

The method of measuring photorefractive damage resistance was to inject a powerful argon laser with a wavelength of 0.488 μm, output of 300 mW, and beam diameter of 1.4 mm into the crystal and to detect the photorefractive damage, or photo induced refractive index change with a weak helium neon laser of 1 mW. An example of the results is given in FIG. 6.

The SAW (Surface Acoustic Wave) grade lithium tantalate monocrystal containing a substantial amount of transient impurities such as iron suffers from extremely large photorefractive damage due to argon laser injection with a power density of 20W/cm$^2$ and the refractive index changes greatly. Lithium tantalate monocrystal with improved crystalline defects such as low angle grain boundaries and with the reduction in impurities to 1/5 (referred to as optical grade) suffers less from photorefractive damage than crystal containing a large amount of iron. However, the quantitative result obtained showed that it is two or more times susceptible to photorefractive damage than the SAW grade lithium niobate monocrystal containing 3 ppm of iron. This result is totally different from previous reports indicating that lithium tantalate monocrystal was more resistant to photorefractive damage than lithium niobate monocrystal. It was also found that in the case of lithium tantalate monocrystal with MgO added, photorefractive damage occurred less as the added amount increased and when 2 mol % or more MgO was added, the photorefractive damage resistance could be improved to a level equal to or greater than that of the optical grade lithium niobate monocrystal with improved photorefractive damage resistance obtained by reducing the iron to a small amount of 1 ppm or less. With the lithium tantalate monocrystal with 3 mol % MgO added, photorefractive damage resistance was improved to a level where no photorefractive damage occurred with the injection power of this argon laser.

Because the segregation coefficient of Mg in lithium tantalate monocrystal of the above congruent composition is more than one, the concentration of Mg in the crystal growing on a seed crystal is larger than that in the melted liquid, so that the Mg concentration in the melted liquid decreases as crystal growth progresses. This means that crystal with uniform Mg concentration in the entire crystal cannot be obtained. Thus, during the growth of MgO-added crystal, the Mg distribution in the crystal was made uniform by using the double-walled crucible method. With a melted liquid composition with 2 mol % or more of MgO added, which was determined earlier as improving photorefractive damage resistance, monocrystal growth was performed by the double-walled crucible method. In the growth process, a double-walled crucible was used and melted liquid to be crystallized using a seed crystal was placed into the inner crucible. The composition of the melted liquid in the inner crucible is the congruent composition plus 2 mol % of MgO. Melted liquid of the same composition as of the growing crystal was previously placed into the outer crucible located outside the inner crucible. Material of the same composition as of the growing crystal was added to the outer crucible by the amount corresponding to the amount of crystal growth so that the composition of the melted liquid would not change during crystal growth. An opening was made between the inner and outer crucibles to allow movement of the material. The crucibles used for crystal growth were made from iridium, with an outer wall diameter of 100 mm and inner wall diameter of 80 mm. Regarding the temperature distribution inside the furnace during crystal growth, the temperature gradient was 50° C./cm directly above the melted liquid and 2°–10° C./cm at the top of the melted liquid. The growth rate was 1.0–2.0 mm/h and crystal rotation was at 10–30 rpm. The crystal growth directions were Y and Z. The crystal diameter was 30 mm and the length 30–70 mm. The uniformity of crystal composition turned out to be good when chemical analysis and evaluation were performed on the top and bottom of the grown crystal for properties greatly dependent on the composition, such as refractive index and Curie temperature.

As described above, an excellent operating effect as explained below is exhibited according to this invention.

Lithium tantalate monocrystal can be obtained in which the fundamental absorption edge is shifted to the shorter wavelength and not only can light transmittance in the short wavelength range of the 280–400 nm band be greatly improved but also photorefractive damage can be greatly reduced.

Consequently, lithium tantalate monocrystal can be used for substrates for photo elements using short wavelength light of 280–400 nm and the stability and output of the SHG element can be enhanced by taking advantage of the large non-linear optical coefficient of lithium tantalate monocrystal.

The present invention is not limited to the foregoing embodiments but many modifications and variations are possible within the spirit and scope of the appended claims of the invention.

What I claim is:

1. A lithium tantalate monocrystal containing 0.1 % or more of Mg by weight and limiting Fe to 10 ppm or less by weight.

2. The lithium tantalate monocrystal substrate according to claim 1 on which a structure with the crystal polarization direction being periodically inverted is produced.

3. A non-linear optical element using light emitted from a laser source as a fundamental wave and generating a harmonic wave via a non-linear optical crystal, wherein lithium tantalate according to claim 1 or lithium tantalate monocrystal substrate according to claim 2 is used as said non-linear optical crystal.

4. A lithium tantalate monocrystal comprising 1 mol % or more of MgO and exhibiting transmittance of light in the 280–400 nm wavelength range.

5. The lithium tantalate monocrystal according to claim 4 whose basic absorption edge is at 280 nm or lower by adding 1 mol % or more of MgO.

6. The lithium tantalate monocrystal substrate according to claim 5 on which a structure with the crystal polarization direction being periodically inverted is produced.

7. The lithium tantalate monocrystal substrate with polarization inverted grid according to claim 6, wherein the polarization inverted areas are greater in depth than in width in the period direction.

8. A non-linear optical element using light emitted from a laser source as a fundamental wave and generating a harmonic wave via a non-linear optical crystal, wherein monocrystal substrate according to claim 7 is used as said non-linear optical crystal.

9. A non-linear optical element using light emitted from a laser source with a wavelength of 800 nm or shorter as a fundamental wave and generating a harmonic wave via a non-linear optical crystal, wherein monocrystal substrate according to claim 7 is used as said non-linear optical crystal.

10. A non-linear optical element using light emitted from a laser source as a fundamental wave and generating a harmonic wave via a non-linear optical crystal, wherein monocrystal substrate according to claim 6 is used as said non-linear optical crystal.

11. A non-linear optical element using light emitted from a laser source with a wavelength of 800 nm or shorter as a fundamental wave and generating a harmonic wave via a non-linear optical crystal, wherein monocrystal substrate according to claim 6 is used as said non-linear optical crystal.

12. A non-linear optical element using light emitted from a laser source as a fundamental wave and generating a harmonic wave via a non-linear optical crystal, wherein lithium tantalate monocrystal according to claim 5 is used as said non-linear optical crystal.

13. A non-linear optical element using light emitted from a laser source with a wavelength of 800 nm or shorter as a fundamental wave and generating a harmonic wave via a non-linear optical crystal, wherein lithium tantalate monocrystal according to claim 5 is used as said non-linear optical crystal.

14. A photo element for controlling light intensity and phase with electro-optical effect or acousto-optical effect by injecting light emitted from a laser source into an electro-optical crystal wherein lithium tantalate monocrystal according to claim 5 is used as substrates for said electro-optical crystal.

15. The lithium tantalate monocrystal substrate according to claim 4 on which a structure with the crystal polarization direction being periodically inverted is produced.

16. The lithium tantalate monocrystal substrate with polarization inverted grid according to claim 15, wherein the polarization inverted areas are greater in depth than in width in the periodic direction.

17. A non-linear optical element using light emitted from a laser source as a fundamental wave and generating a harmonic wave via a non-linear optical crystal, wherein monocrystal substrate according to claim 16 is used as said non-linear optical crystal.

18. A non-linear optical element using light emitted from a laser source with a wavelength of 800 nm or shorter as a fundamental wave and generating a harmonic wave via a non-linear optical crystal, wherein monocrystal substrate according to claim 16 is used as said non-linear optical crystal.

19. A non-linear optical element using light emitted from a laser source as a fundamental wave and generating a harmonic wave via a non-linear optical crystal, wherein monocrystal substrate according to claim 15 is used as said non-linear optical crystal.

20. A non-linear optical element using light emitted from a laser source with a wavelength of 800 nm or shorter as a fundamental wave and generating a harmonic wave via a non-linear optical crystal, wherein monocrystal substrate according to claim 15 is used as said non-linear optical crystal.

21. A non-linear optical element using light emitted from a laser source as a fundamental wave and generating a harmonic wave via a non-linear optical crystal, wherein lithium tantalate monocrystal according to claim 4 is used as said non-linear optical crystal.

22. A non-linear optical element using light emitted from a laser source with a wavelength of 800 nm or shorter as a fundamental wave and generating a harmonic wave via a non-linear optical crystal, wherein lithium tantalate monocrystal according to claim 4 is used as said non-linear optical crystal.

23. A photo element for controlling light intensity and phase with electro-optical effect or acousto-optical effect by injecting light emitted from a laser source into an electro-optical crystal wherein lithium tantalate monocrystal according to claim 4 is used as substrates for said electro-optical crystal.

24. A lithium tantalate monocrystal whose photorefractive damage resistance is improved by adding 1 mol % or more of MgO.

25. The lithium tantalate monocrystal according to claim 24 whose photorefractive damage resistance is improved by adding preferably 2 mol % or more of MgO.

26. A non-linear optical element using light emitted from a laser source as a fundamental wave and generating a harmonic wave via a non-linear optical crystal, wherein lithium tantalate monocrystal according to claim 25 is used as said non-linear optical crystal.

27. A photo element for controlling light intensity and phase with electro-optical effect or acousto-optical effect by injecting light emitted from a laser source into an electro-optical crystal wherein lithium tantalate monocrystal according to claim 25 is used as substrates for said electro-optical crystal.

28. Lithium tantalate monocrystal according to claim 24 which is produced by lithium tantalate monocrystal production equipment comprising a double-walled crucible for holding melted liquid, a heating means mounted on the periphery of said crucible, and a means for obtaining monocrystal by allowing a seed crystal to contact the melted liquid in said crucible and drawing up the seed crystal.

29. A non-linear optical element using light emitted from a laser source as a fundamental wave and generating a harmonic wave via a non-linear optical crystal, wherein lithium tantalate monocrystal according to claim 28 is used as said non-linear optical crystal.

30. A photo element for controlling light intensity and phase with electro-optical effect or acousto-optical effect by injecting light emitted from a laser source into an electro-optical crystal wherein lithium tantalate monocrystal according to claim 28 is used as substrates for said electro-optical crystal.

31. A non-linear optical element using light emitted from a laser source as a fundamental wave and generating a harmonic wave via a non-linear optical crystal, wherein lithium tantalate monocrystal according to claim 24 is used as said non-linear optical crystal.

32. A photo element for controlling light intensity and phase with electro-optical effect or acousto-optical effect by injecting light emitted from a laser source into an electro-optical crystal wherein lithium tantalate monocrystal according to claim 24 is used as substrates for said electro-optical crystal.

* * * * *